(12) United States Patent
Kamath et al.

(10) Patent No.: US 8,446,198 B2
(45) Date of Patent: May 21, 2013

(54) PHASE INTERPOLATOR AND A DELAY CIRCUIT FOR THE PHASE INTERPOLATOR

(75) Inventors: Anant Shankar Kamath, Bangalore (IN); Krishnaswamy Nagaraj, Plano, TX (US); Sudheer Kumar Vemulapalli, Allen, TX (US); Jayawardan Janardhanan, Bangalore (IN); Karthik Subburaj, Bangalore (IN); Sujoy Chakravarty, Bangalore (IN); Vikas Sinha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 273 days.

(21) Appl. No.: 12/761,419

(22) Filed: Apr. 16, 2010

(65) Prior Publication Data

US 2011/0254603 A1 Oct. 20, 2011

(51) Int. Cl.
*H03L 7/00* (2006.01)
(52) U.S. Cl.
USPC .......................................................... 327/161
(58) Field of Classification Search
USPC .................................................. 327/158, 161
See application file for complete search history.

(56) References Cited

U.S. PATENT DOCUMENTS

| 7,046,058 B1 * | 5/2006 | Fang et al. ..................... 327/158 |
| 2009/0140773 A1 * | 6/2009 | Cheung ............................ 327/3 |

OTHER PUBLICATIONS

Rainer Kreienkamp, Ulrich Langmann, Christoph Zimmermann, Takuma Aoyama and Hubert Siedhoff, "A 10-Gb/s CMOS Clock and Data Recovery Circuit With an Analog Phase Interpolator", IEEE Journal of Solid-State Circuits, Mar. 2005, pp. 736-743, vol. 40, No. 3.

* cited by examiner

*Primary Examiner* — Daniel Rojas
(74) *Attorney, Agent, or Firm* — John R. Pessetto; W. James Brady; Frederick J. Telecky, Jr.

(57) ABSTRACT

Phase interpolator and a delay circuit for the phase interpolator. The phase interpolator includes a variable delay circuit to rotate phase of an input clock to generate a phase rotated signal. The phase interpolator also includes a delay locked loop coupled to the variable delay circuit to generate a plurality of phase shifted outputs. The delay locked loop includes a plurality of delay elements. Each delay element includes a multiplexer and a delay cell coupled to the multiplexer. The multiplexer is configurable using a first control signal to output one of the phase rotated signal and a phase shifted output of the plurality of phase shifted outputs. The delay cell delays one of the phase rotated signal and the phase shifted output to generate another phase shifted output of the plurality of phase shifted outputs.

2 Claims, 10 Drawing Sheets

PHASE INTERPOLATOR AND A DELAY CIRCUIT FOR THE PHASE INTERPOLATOR

TECHNICAL FIELD

Embodiments of the disclosure relate to a phase interpolator and a delay circuit for the phase interpolator.

BACKGROUND

A phase interpolator is a circuit that generates one or more phase-shifted outputs from one or more phases of an input clock. For example, if the input clock is expressed as A sin(ωt), the phase interpolator generates A sin(ωt+θ) as an output, where θ can vary from 0 to 360 degrees. θ is generally a function [f(k)] of a control signal k and can be varied using the control signal.

An existing phase interpolator includes a current mode logic (CML) summer to perform weighted sum of different phases of the input clock to generate the phase shifted outputs. As weights of the different phases are varied, different phase shifted outputs are obtained. The weights can be varied using tail currents of the CML summer. However, the CML summer leads to high power consumption and is area inefficient. For example, to generate four phase shifted outputs eight CML summer stages, each CML summer stage having two CML transistors, are required. Also, parasitic capacitance is present at output of each CML summer stage leading to high power consumption during charging and discharging. Further, the CML summer stages result in destructive interference between phases and hence the phase shifted outputs are obtained with a lower swing than that required. Thus, differential to single ended converters are required for level shifting the phase shifted outputs with lower swing to desired swing. Use of the differential to single ended converters increases power, cost and area.

SUMMARY

An example of a phase interpolator includes a variable delay circuit to rotate phase of an input clock to generate a phase rotated signal. The phase interpolator also includes a delay locked loop coupled to the variable delay circuit to generate a plurality of phase shifted outputs. The delay locked loop includes a plurality of delay elements. Each delay element includes a multiplexer and a delay cell coupled to the multiplexer. The multiplexer is configurable using a first control signal to output one of the phase rotated signal and a phase shifted output of the plurality of phase shifted outputs. The delay cell delays one of the phase rotated signal and the phase shifted output to generate another phase shifted output of the plurality of phase shifted outputs.

An example of a delay circuit includes an inverter coupled between an input terminal of the delay circuit and an output terminal of the delay circuit. The delay cell also includes one or more capacitive elements coupled to the output terminal of the delay circuit to enable generation of desired delay. Each capacitive element includes a positive metal oxide semiconductor (PMOS) transistor having drain and source coupled to the output terminal of the delay circuit and having gate connection that is configurable using a control signal to enable the PMOS transistor to provide capacitance. Each capacitive element also includes a negative metal oxide semiconductor (NMOS) transistor with source and drain coupled to the output terminal of the delay circuit and having gate connection that is configurable using the control signal to enable the NMOS transistor to provide capacitance.

An example of a method includes rotating phase of an input clock to generate a first phase rotated signal in a first time period. The method also includes rotating phase of the input clock to generate a second phase rotated signal in a second time period. Further, the method includes selectively providing one of the first phase rotated signal and the second phase rotated signal as a phase rotated signal to a delay locked loop. Moreover, the method includes generating a plurality of phase shifted outputs by the delay locked loop from the phase rotated signal.

BRIEF DESCRIPTION OF THE VIEWS OF DRAWINGS

In the accompanying figures, similar reference numerals may refer to identical or functionally similar elements. These reference numerals are used in the detailed description to illustrate various embodiments and to explain various aspects and advantages of the disclosure.

DETAILED DESCRIPTION OF THE EMBODIMENTS

Figure 1:
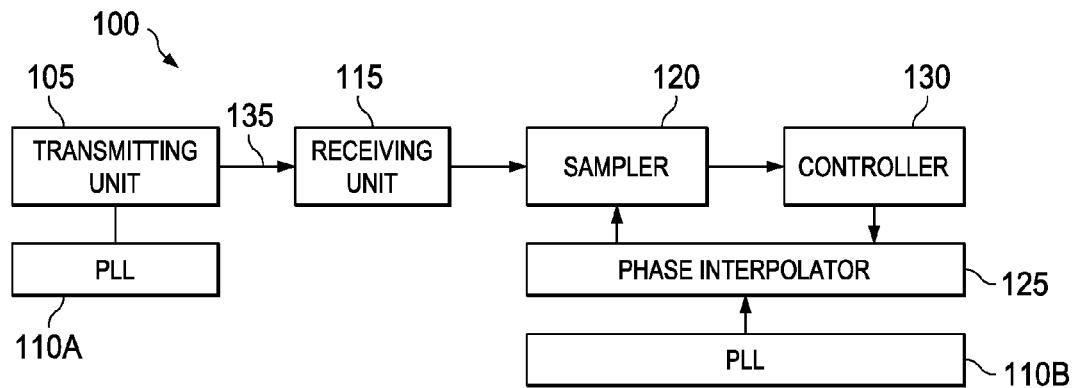
FIG. 1 illustrates an environment, in accordance with one embodiment.

FIG. 1 illustrates an environment 100. The environment 100 includes a transmitting unit 105 coupled to a phase locked loop (PLL) 110A. The transmitting unit 105 is included in a first chip which can be referred to as a transmitting chip.

The environment 100 also includes a receiving unit 115 coupled to a sampler 120. The sampler 120 is coupled to a phase interpolator 125 and a controller 130. The phase interpolator 125 is also coupled to a PLL 110B. The receiving unit 115 is included in a second chip that can be referred to as a receiving chip.

In order to communicate data signal from the transmitting chip to the receiving chip across a channel 135 and to extract data from the data signal, it is desired that the receiving chip determines when to sample the data signal. Information regarding when to sample the data signal can be provided by a clock sent from the transmitting chip to the receiving chip along the channel 135. The clock can be generated by the PLL 110A. The clock can be sent using a timing signal line adjacent to a data signal line. However, using separate timing signal line for transmitting the clock may not be feasible due to increased cost, area and power. Hence, the controller 130 that is capable of running a clock data recovery (CDR) process or that includes a clock data recovery (CDR) circuit can be used at the receiving chip to determine when to sample the data signal. The controller 130 having capability of running the CDR process replaces requirement of the separate timing signal line.

The PLL 110B generates an input clock that is used by the phase interpolator 125 to generate a plurality of phase shifted outputs. In one example, the phase interpolator 125 is used to generate four phase shifted outputs from the input clock. The four phase shifted outputs are provided to the sampler 120 to sample the data signal appropriately to extract data from the data signal. The controller 130 including the CDR circuit controls the phase interpolator 125 to enable generation of the four phase shifted outputs.

Example of the channel 135 include, but are not limited to, optical fiber cable, coaxial cable, twisted pair, copper wire, and air.

Figure 2:
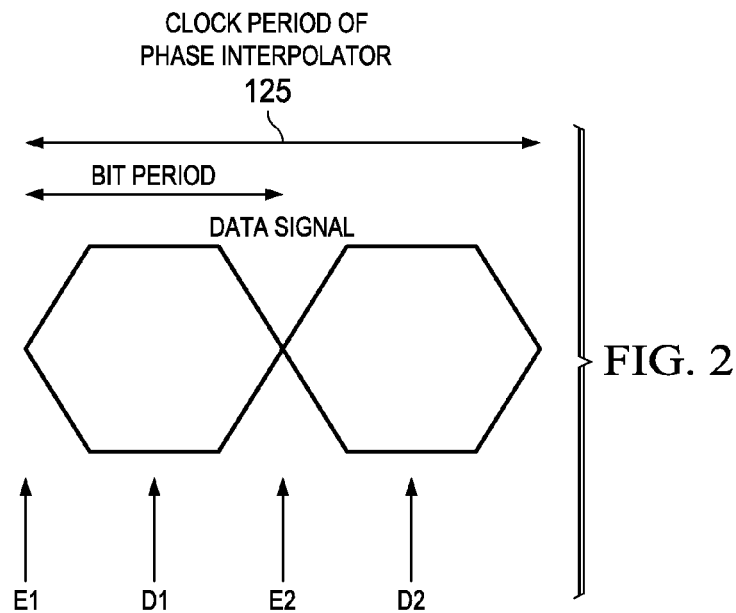
FIG. 2 illustrates an example of a data signal for a clock period of a phase interpolator, in accordance with one embodiment.

Referring to FIG. 2 now, an example of the data signal is shown for a clock period of the phase interpolator 125. Four phases shifted outputs, for example E1, D1, E2 and D2 are generated by the phase interpolator. E1 and E2 correspond to edge sampling, and D1 and D2 correspond to data sampling. The edge sampling can be defined as sampling of the data signal at edges of a bit period. The data sampling can be defined as sampling of the data signal at center of a bit period. For every bit, 2 samples from the data signal are considered to extract correct bit. The two samples include a sample corresponding to E1 which can also be referred to as an edge sample, and a sample corresponding to D1 which can also be referred to as a data sample. The sample can be defined as value of the data signal at an instant. Similarly, edge sample corresponding to E2 and data sample corresponding to D2 can be used to extract next correct bit.

When the phase shifted outputs E1 and E2 are aligned with the edge of corresponding bit period and the phase shifted outputs D1 and D2 are aligned with the center of corresponding bit period then CDR process is considered as locked. The CDR process runs in the controller 130. If the CDR process is not correctly locked then the controller 130 detects whether the CDR process is early or late, and enables varying of phases of the phase shifted outputs to lock the CDR process and hence align phase shifted outputs with edges and centers of bit periods. The controller 130 varies phases of the phase shifted outputs by incrementing or decrementing phases using the phase interpolator 125.

The CDR process can be early or late due to presence of jitter in the input clock.

In one example, if D1 is towards right of the center of the bit period then the CDR process is detected to be late. If D1 is towards left of the center of the bit period then the CDR process is detected to be early. Various existing techniques can be used by the controller 130 to detect whether the CDR process is early or late. For example, the data sample and the edge sample can be analyzed over several bit periods. In illustrated example, N=1000 is the number of bit periods. Analysis of the data sample and the edge sample for the N bit periods can then be used to detect whether the CDR process is early or late. If the edge sample is same as the data sample for more than 50% of the N bit periods, for example more than 500 bit periods, then the CDR process can be detected as late. If the edge sample is different from the data sample in more than 50% of the N bit periods, for example more than 500 bit periods, then the CDR process can be detected as early. When the CDR process is early then the controller 130 increments phases of the phase shifted outputs using the phase interpolator 125. When the CDR process is late then the controller 130 decrements phases of the phase shifted outputs using the phase interpolator 125.

It is noted that the present disclosure is explained using four phase shifted outputs. Similar functioning is also applicable to N number of phase shifted outputs, where N is a natural number.

The controller 130 is capable of controlling the phase interpolator 125 to adjust the phase shifted outputs in two different cases. In one case, there is no frequency mismatch between the clock of the transmitting chip and the input clock of the receiving chip. However, jitter can be present in the input clock. In another case, there is a frequency mismatch between the clock of the transmitting chip and the input clock of the receiving chip. Different circuits for phase interpolators that are capable of adjusting the phase shifted outputs with and without frequency mismatch are now discussed.

Figure 3:
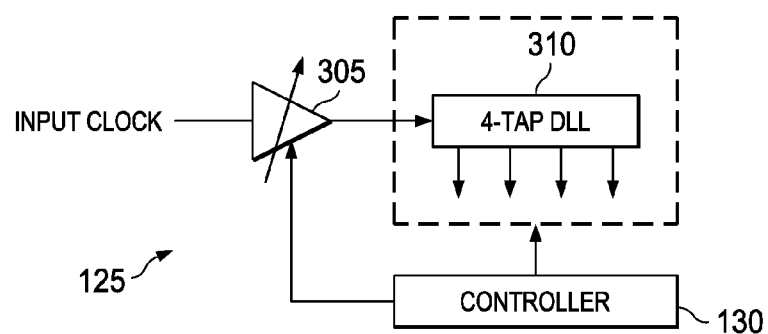
FIG. 3 illustrates a phase interpolator, in accordance with one embodiment.

Referring to FIG. 3 now, the phase interpolator 125 that performs phase interpolation in absence of the frequency mismatch to generate the phase shifted outputs is provided. The phase interpolator 125 includes a variable delay circuit 305 coupled to a delay locked loop (DLL) 310. The phase interpolator 125 is used to generate four phase shifted outputs and hence the DLL 310 is a four-tap DLL to enable generation of the four phase shifted outputs.

Due to presence of the jitter in the input clock there can be misalignment of the phase shifted outputs with the edges and the centers of the bit periods. The variable delay circuit 305 rotates phase of the input clock to generate a phase rotated signal in order to enable alignment of the phase shifted outputs with the edges and the centers of the bit periods. Amount of phase rotation of the input clock is controlled by the controller 130 and is determined based on amount of misalignment of the phase shifted outputs with the edges and the centers of the bit periods. The DLL 310 receives the phase rotated signal and generates the phase shifted outputs. The phase rotated signal can be defined as the input clock delayed by a desired delay. The desired delay can be generated using the variable delay circuit 305 or other variable delay circuits described later in the present disclosure.

The DLL 310 includes four delay cells coupled in series connection. The four delay cells can together be referred to as a delay line. Each delay cell of the four delay cells generates one phase shifted output. For example, a first delay cell delays the phase rotated signal by a phase equivalent to time duration. The time duration can be based on the delay cell. Output of the first delay cell can be referred to as a first phase shifted output. Second delay cell of the delay line delays the output of the first delay cell by the phase equivalent to the time duration to generate a second phase shifted output. Similarly, third delay cell of the delay line delays output of the second delay cell by the phase equivalent to the time duration to generate a third phase shifted output and fourth delay cell of the delay line delays output of the third delay cell by the phase equivalent to the time duration to generate a fourth phase shifted output.

The variable delay circuit 305 can be controlled by the controller 130 using a digital code (second control signal). As the digital code is varied from a minimum value to a maximum value, the input clock is delayed by time duration corresponding to the digital code. Difference between the minimum value and the maximum value is indicative of delay or the time duration. Delaying the input clock by the time duration is equivalent to rotating phase of the input clock. When the digital code reaches the maximum value, the CDR process ceases to be locked. Similarly, when the digital code reaches the minimum value as the digital code is varied from maximum value to minimum value, the CDR process ceases to be locked.

It is noted that controlling of the variable delay circuit 305 using the digital code is explained in the present disclosure as an example and the variable delay circuit 305 can also be controlled by an analog control voltage. Also, the variable delay circuit 305 can have a controller specific to the variable delay circuit 305 that can be used for controlling instead of the controller 130.

Figure 4:
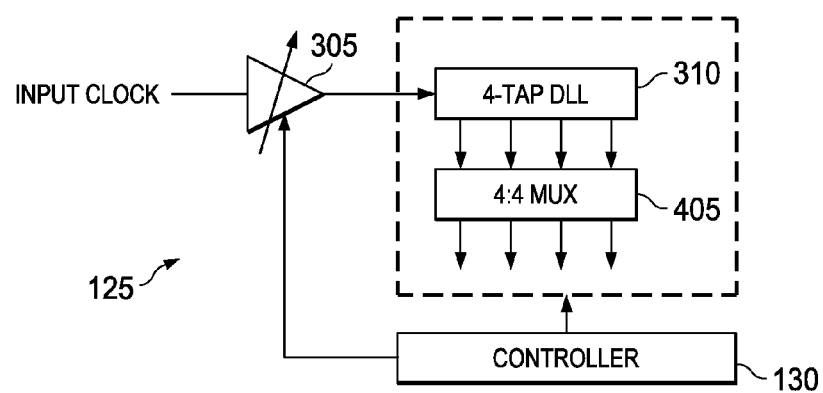
FIG. 4 illustrates a phase interpolator, in accordance with another embodiment.

Referring to FIG. 4 now, the phase interpolator 125 that performs phase interpolation in presence of the frequency mismatch to generate the phase shifted outputs is provided. The phase interpolator 125 includes the variable delay circuit 305 coupled to the DLL 310. The phase interpolator 125 also includes a multiplexer (MUX) 405 coupled to the DLL 310. Working of the variable delay circuit 305 is similar to that explained in FIG. 3.

Working of the DLL 310 is similar to that explained in FIG. 3. However, the first delay cell of the DLL 310 delays the phase rotated signal by a phase equivalent to time duration of T/4, where T is the time period of the input clock. The second delay cell of the DLL 310 delays the output of the first delay cell by the phase equivalent to the time duration of T/4. The third delay cell of the DLL 310 delays the output of the second delay cell by the phase equivalent to the time duration of T/4. The fourth delay cell of the DLL 310 delays the output of the third delay cell by the phase equivalent to the time duration of T/4.

The digital code to the variable delay circuit 305 in FIG. 4 can be determined using a calibration circuit coupled to the controller 130. The calibration circuit ensures that difference between the maximum delay and the minimum delay of the variable delay circuit 305 is equal to T/4. The calibration circuit is described in FIG. 12.

The MUX 405 is a 4:4 MUX that can select any one of four input signals on four input lines as an output signal on any one of four output lines.

The four phase shifted outputs of the DLL 310 are provided as four input signals to the MUX 405. The MUX 405 is controlled using the controller 130 to perform selection from the four input signals and appropriately output the four input signals as the four phase shifted outputs.

When the digital code to the variable delay circuit 305 reaches the maximum value, the digital code is reset to the minimum value using the controller 130. The phase rotated signal now given to the DLL 310 is advanced by T/4. Hence, the MUX 405 selects the output of the second delay element of the DLL 310 as the first phase shifted output since output of the second delay element after advancement is identical to the output of the first delay element before the advancement. Shift in the input clock by T/4 thus does not affect the phase shifted outputs of the phase interpolator 125. The MUX 405 thus ensures that T/4 delay does not reflect in the phase shifted outputs. The timing requirement of the MUX 405 is T/4. Within time duration of T/4, the MUX 405 has to switch from providing the output of the first delay element as the first phase shifted output to providing the output of the second delay element as the first phase shifted output. Timing diagram of the input clock and the four phase shifted outputs is explained in conjunction with FIG. 5.

The controller 130 maintains CDR process lock by adjusting the digital code from the maximum value to the minimum value. The adjustment provides the CDR process with a large variable delay range.

Figure 5:
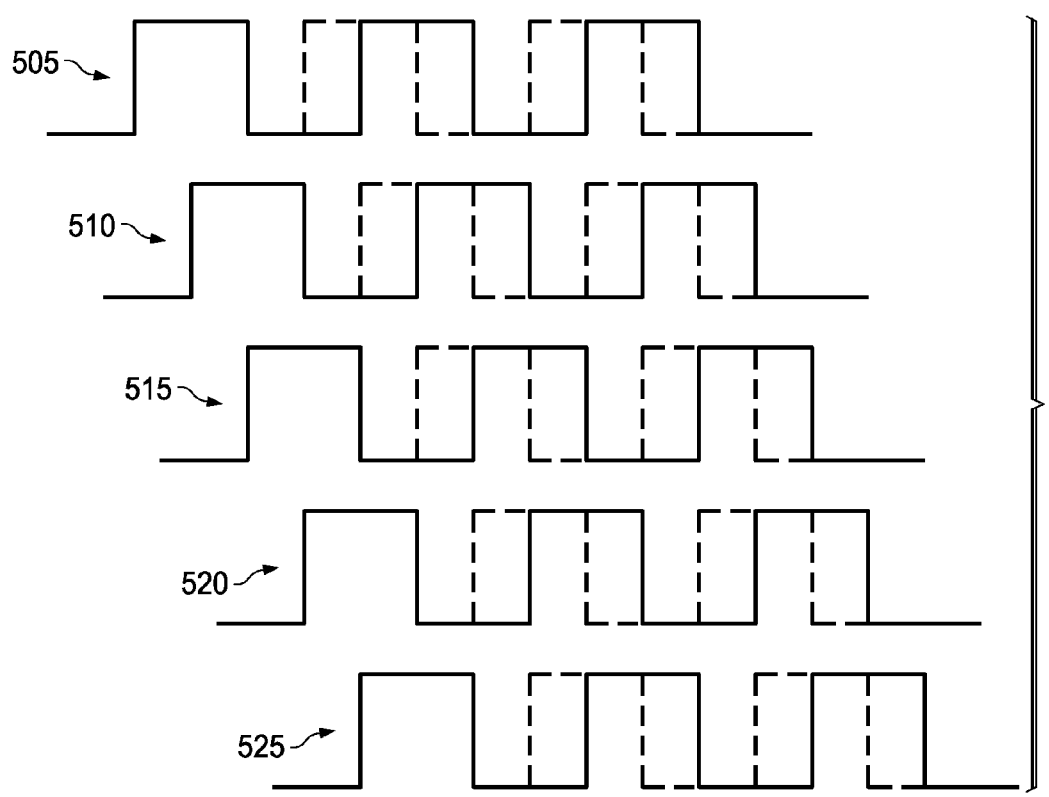
FIG. 5 illustrates waveforms for an input and outputs of the phase interpolator of FIG. 4.

Referring to FIG. 5 now, a waveform 505 corresponds to the input clock. A waveform 510 corresponds to the first phase shifted output, a waveform 515 corresponds to the second phase shifted output, a waveform 520 corresponds to the third phase shifted output and a waveform 525 corresponds to the fourth phase shifted output. Solid lines indicate original waveforms and dotted lines indicate waveforms with change in time or equivalently in phase.

As indicated by dotted lines of the waveform 505, when the digital code to the variable delay circuit 305 is reset to the minimum value, the input clock is advanced in time by T/4. Similarly, dotted lines of the waveform 510, the waveform 515, the waveform 520, and the waveform 525 represents corresponding phase shifted output being advanced by T/4. Hence, the MUX 405 has to switch between the outputs of the delay elements to ensure that advancement due to change in the input clock do not appear in the phase shifted outputs. The MUX 405 outputs the waveform 510 as the first phase shifted output before the advancement and the waveform 515 as the first phase shifted output after the advancement by T/4. When the digital code is reset from the minimum value to the maximum value when the digital code reaches the minimum value then the input clock is delayed by T/4 and hence the waveform 510 is then selected back as the first phase shifted output.

It is noted that when the digital code is changed from the minimum value to the maximum value or from the maximum value to the minimum value to control delay of the variable delay circuit 305, the input clock may not be delayed immediately. Delay in the input clock and hence change in the phase rotated signal may reflect after a certain settling time of the variable delay circuit 305. To avoid effect of the settling time a plurality of instances of the variable delay circuit 305 can be used. A first instance can be referred to as a first variable delay circuit and a second instance can be referred to as a second variable delay circuit. The phase interpolator 125 that includes multiple instances of the variable delay circuit 305 is explained in conjunction with FIG. 6.

Figure 6:
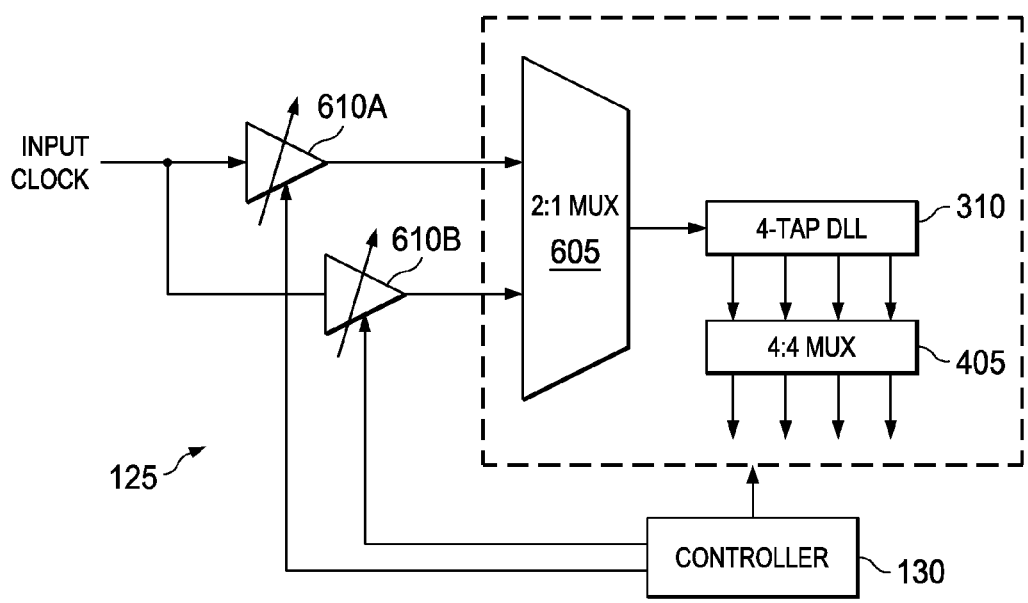
FIG. 6 illustrates a phase interpolator, in accordance with yet another embodiment.

Referring to FIG. 6 now, the phase interpolator 125 includes the first variable delay circuit, for example a variable delay circuit 610A, and the second variable delay circuit, for example a variable delay circuit 610B. The variable delay circuit 610A and the variable delay circuit 610B are coupled to input terminals of a MUX 605. Output terminal of the MUX 605 is coupled to the DLL 310. The MUX 605 is also coupled to and can be controlled using the controller 130. The MUX 605 is further coupled to the DLL 310 which is in turn coupled to the MUX 405.

The working of the DLL 310 and the MUX 405 remains similar to that described in FIG. 5. The structure of the variable delay circuit 610A and of the variable delay circuit 610B is similar to that of the variable delay circuit 305. In some embodiments, the variable delay circuit 610A and the variable delay circuit 610B in conjunction can be referred to as a variable delay circuit of the phase interpolator 125.

The variable delay circuit 610A generates a first phase rotated signal from the input clock in a first time period and the variable delay circuit 610B generates a second phase rotated signal from the input clock in a second time period. The MUX 605 selects one of the first phase rotated signal and the second phase rotated signal as the phase rotated signal. The phase rotated signal is provided as an input to the DLL 310. The selection can be performed using the controller 130.

In some embodiments, the first time period and the second time period are equal for a particular frequency mismatch between the clock of the transmitting chip and the input clock of the receiving chip.

In one example, the first phase rotated signal is selected using the MUX 605 as the phase rotated signal and provided to the DLL 310. The digital code of the variable delay circuit 610A is varied to control the delay of the variable delay circuit 610A, and once the digital code approaches an extreme value, for example the maximum value, then the second phase rotated signal can be selected by the MUX 605 as the phase rotated signal and provided to the DLL 310. The variable delay circuit 610B can be activated with the digital code at the minimum value slightly before the digital code of the variable delay circuit 610A reaches the extreme value so that the variable delay circuit 610B settles down before the digital code of the variable delay circuit 610A reaches the extreme value. Since the variable delay circuit 610B is available with the digital code at the minimum value, the effect of the settling time is avoided and selection of the second phase rotated signal as the phase rotated signal can be performed with minimal error being reflected in the phase rotated signal. The variable delay circuit 610A can then be inactivated. Further, the variable delay circuit 610A can be activated slightly before the digital code of the variable delay circuit 610B reaches the extreme value.

The controlling of the variable delay circuit 610A and the variable delay circuit 610B can be performed using the controller 130 and a calibration circuit. The calibration circuit helps in setting the digital code (second control signal) and is explained in conjunction with FIG. 10.

The MUX 405 needs precise control to provide appropriate phase shifted outputs. For example, when the digital code to the variable delay circuit 610A reaches the maximum value and the second phase rotated signal is selected as the phase rotated signal then the phase rotated signal given to the DLL 310 is advanced by T/4. Hence, the MUX 405 selects the output of the second delay element of the DLL 310 as the first phase shifted output since output of the second delay element after advancement is identical to the output of the first delay element before the advancement. Such precise control of the MUX 405 may have stringent timing requirement and hence may not be always feasible. A phase interpolator 125 without the MUX 405 is explained in conjunction with FIG. 7.

Figure 7:
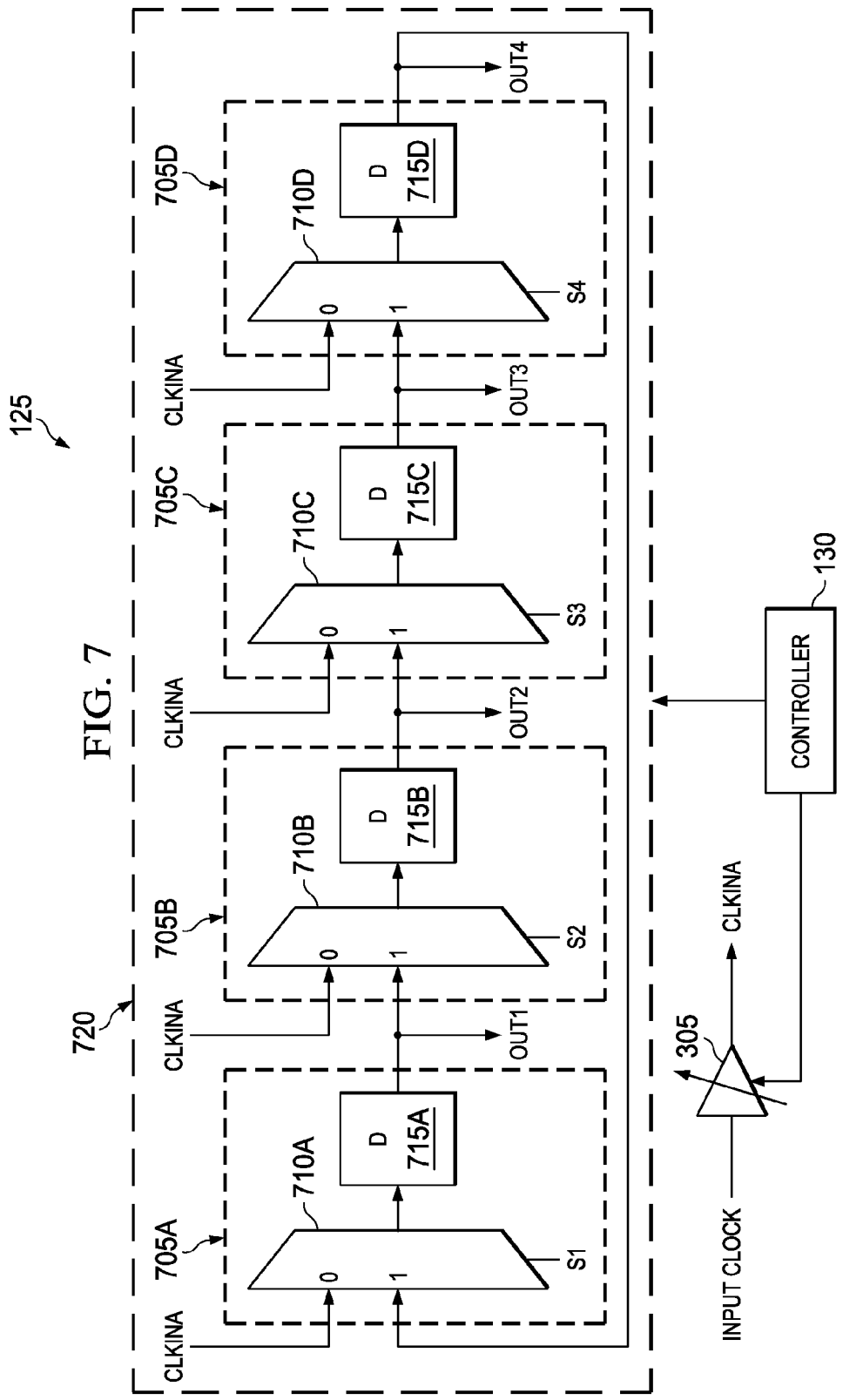
FIG. 7 illustrates a phase interpolator, in accordance with still another embodiment.

Referring to FIG. 7 now, the phase interpolator 125 includes the variable delay circuit 305. The variable delay circuit is coupled to the DLL 720. The DLL 720 includes a plurality of delay elements, for example a delay element 705A to a delay element 705D. The delay elements are coupled in a series connection. Each delay element includes a MUX and a delay cell (D). For example, the delay element 705A includes a MUX 710A and a delay cell 715A. Output of each delay element is coupled to an input terminal of a MUX of next delay element in the DLL 720. Other input terminal of the MUX of each delay element is coupled to the variable delay circuit 305 to receive the phase rotated signal (CLKINA). Output of the MUX of each delay element is coupled to the delay cell of that delay element. Output of each delay element defines a phase shifted output. The MUX of each delay element is also coupled to the controller 130 to receive a control signal or a select signal.

It is noted that the DLL 720 can include elements other than the delay cells and the multiplexers. FIG. 7 illustrates a portion, for example a delay line, of the DLL 720. The delay line includes the delay cells and the multiplexers.

Control signals of the MUX 710A, a MUX 710B, a MUX 710C, and a MUX 610D are denoted as S1, S2, S3, and S4 respectively. Control signals can be received from the controller 130 and can together be referred to as a first control signal. Outputs of the delay cell 715A, a delay cell 715B, a delay cell 715C, and a delay cell 715D are denoted as OUT 1, OUT 2, OUT 3, and OUT 4, respectively. Delay of each delay element, or sum of delay of each delay cell and delay of corresponding MUX is equal to T/4.

In some embodiments, the DLL 720 can include a DLL controller coupled to the delay elements. The DLL controller can ensure that delay of each delay element is equal to T/4 and can control the delay of each delay element by generating the control signals.

Each MUX receives the first control signal and is responsive to the first control signal to output either the CLKINA or a phase shifted output that is input to the MUX. For example, when S1 is zero, CLKINA is selected as output of the MUX 710A and when S1 is one then OUT 4 (the phase shifted output) is selected as the output of the MUX 710A. The delay cell 715B then delays the CLKINA when S1 is zero or delays the out4 when S1 is one and provides OUT 1. Similar working applies to a delay element 705B, a delay element 705C and the delay element 705D. At any instant, one of the control signals is zero and other control signals are one. Hence, CLKINA enters the DLL 720 through one of the multiplexers and generates four phase shifted outputs.

Working of the phase interpolator 125 is now explained with an example. Consider S2 is zero and S1, S3, S4 are one. CLKINA enters the DLL 720 through the MUX 710B. Out1 is delayed by one clock period as compared to CLKINA since out1 is obtained by passing CLKINA through the four delay elements, and total delay through the four delay elements is 4*T/4=T. Hence CLKINA and out1 are identical. When the digital code of the variable delay circuit 305 reaches an extreme value, for example the maximum value then the digital code is reset to other extreme value, for example the minimum value resulting in advancement of CLKINA by T/4. The CLKINA after advancement by T/4 can be referred to as a new CLKINA. OUT 1 and the new CLKINA now cease to be identical. However, the new CLKINA and OUT 4 are identical. The controller 130 then sets S1 to zero and S2, S3 and S4 to one. Signals at the input terminals of the MUX 710A are similar since out 4 is delayed version of CLKINA by 3T/4 and the new CLKINA is advanced version of CLIKINA by T/4. The advanced version of CLKINA by T/4 is equal to CLKINA−T/4. Since the inputs at the input terminals of the MUX 710A are similar there is no glitch at output of the MUX 710A and hence no glitch in OUT 1. Similarly, there is no glitch at OUT 2, OUT 3 and OUT 4.

Figure 8:
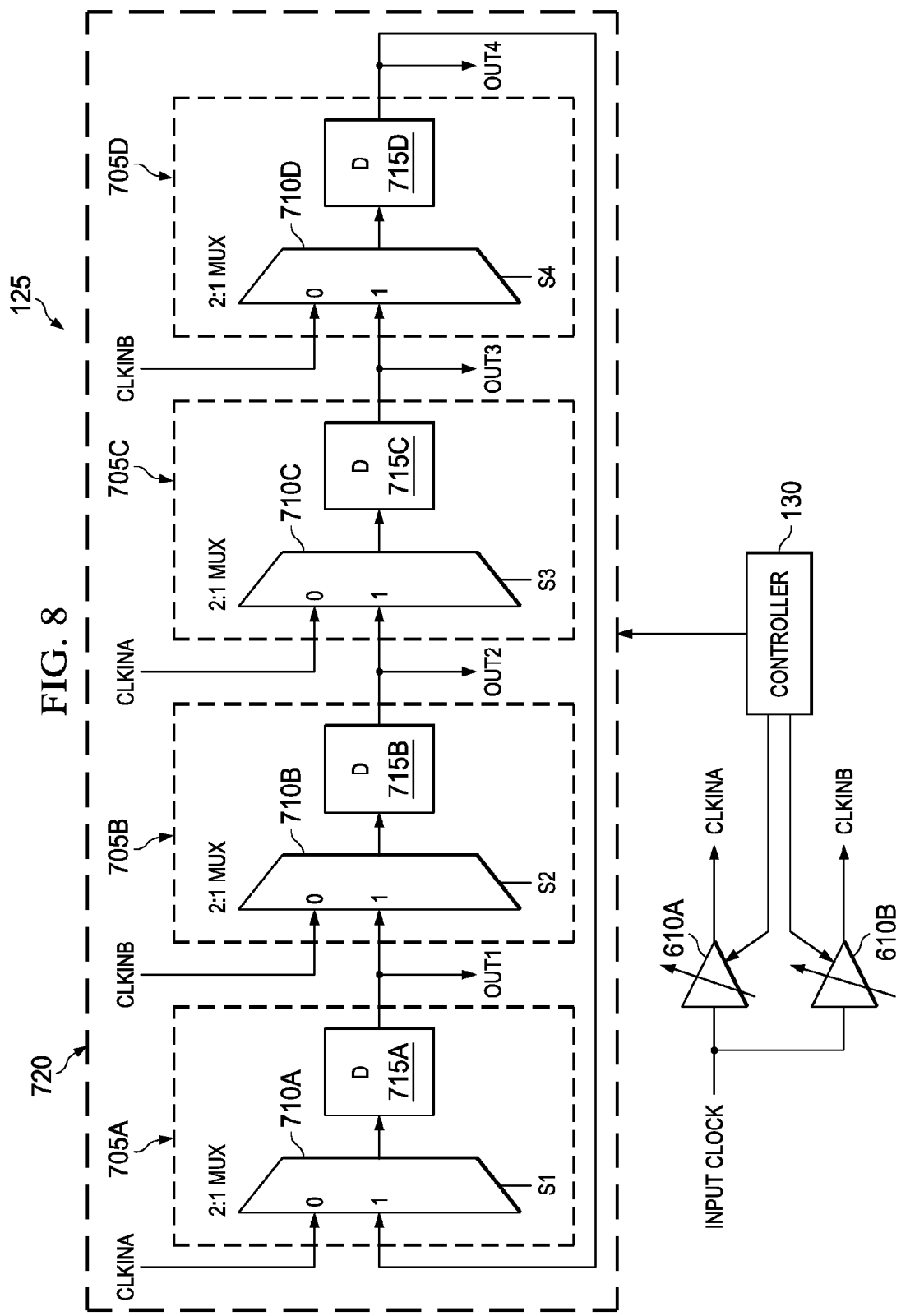
FIG. 8 illustrates a phase interpolator, in accordance with still another embodiment.

Referring to FIG. 8 now, the phase interpolator 125 includes the first variable delay circuit, for example the variable delay circuit 610A, and the second variable delay circuit, for example the variable delay circuit 610B. The variable delay circuit 610A and the variable delay circuit 610B are coupled to the DLL 720. The variable delay circuit 610A and the variable delay circuit 610B in conjunction can be referred to as a variable delay circuit.

Structure of the DLL 720 is similar to that described in the FIG. 7 except one input terminal of the MUX 710A and of the MUX 710C being coupled to the variable delay circuit 610A, and one input terminal of the MUX 710B and of the MUX 710D being coupled to the variable delay circuit 610B.

The variable delay circuit 610A generates the first phase rotated signal (CLKINA) in the first time period and the variable delay circuit 610B generates the second phase rotated signal (CLKINB) in the second time period. The CLKINA and the CLKINB can be selectively provided to the DLL 720 using the control signals or the select signals of the multiplexers. For example, when S1 is zero then the CLKINA can be selected as the phase rotated signal and provided to the DLL 720. The control signals can together be referred to as a first control signal.

Working of the phase interpolator 125 is now explained with an example. Consider that S2 is zero and S1, S3, S4 are one. CLKINB enters the DLL 720 at the input terminal of the MUX 710B. The CLKINB is then outputted by the MUX 710B. The delay cell 715B delays the CLKINB to generate out 2 (the phase shifted output). OUT 2 is then provided to the delay cell 715C by the MUX 710C. The delay cell generates the out 3. Similarly, out 1 and out 4 are generated. Delay of each delay element, or sum of delay of each delay cell and corresponding multiplexer is T/4. Out1 is delayed by one clock period as compared to CLKINB since OUT 1 is obtained by passing CLKINB through the four delay elements, and total delay through the four delay elements is 4*T/4=T.

The variable delay circuit 610B is active and generates the CLKINB. When the digital code of the variable delay circuit 610B is detected to reach the extreme value by the controller 130 then the controller 130 activates the variable delay circuit 610A slightly before the time when the digital code of the variable delay circuit 610B reaches the extreme value. The variable delay circuit 610A then settles down by the time the digital code of the variable delay circuit 610B reaches the extreme value. The controller 130 then sets S1 to zero and S2, S3 and S4 to one. Setting S1 to zero results in similar inputs at the input terminals of the MUX 710A as OUT 4 is delayed version of CLKINB by 3T/4 and the CLKINA is advanced version of CLIKINB by T/4. The advanced version of CLKINB by T/4 is equal to CLKINB−T/4. Since the inputs at the input terminals of the MUX 710A are similar there is no glitch at output of the MUX 710A and hence no glitch in out 1. Similarly, there is no glitch at OUT 2, OUT 3 and OUT 4. The phase shifted outputs OUT 1, OUT 2, OUT 3 and OUT 4 are explained with help of waveforms in FIG. 9.

Figure 9:
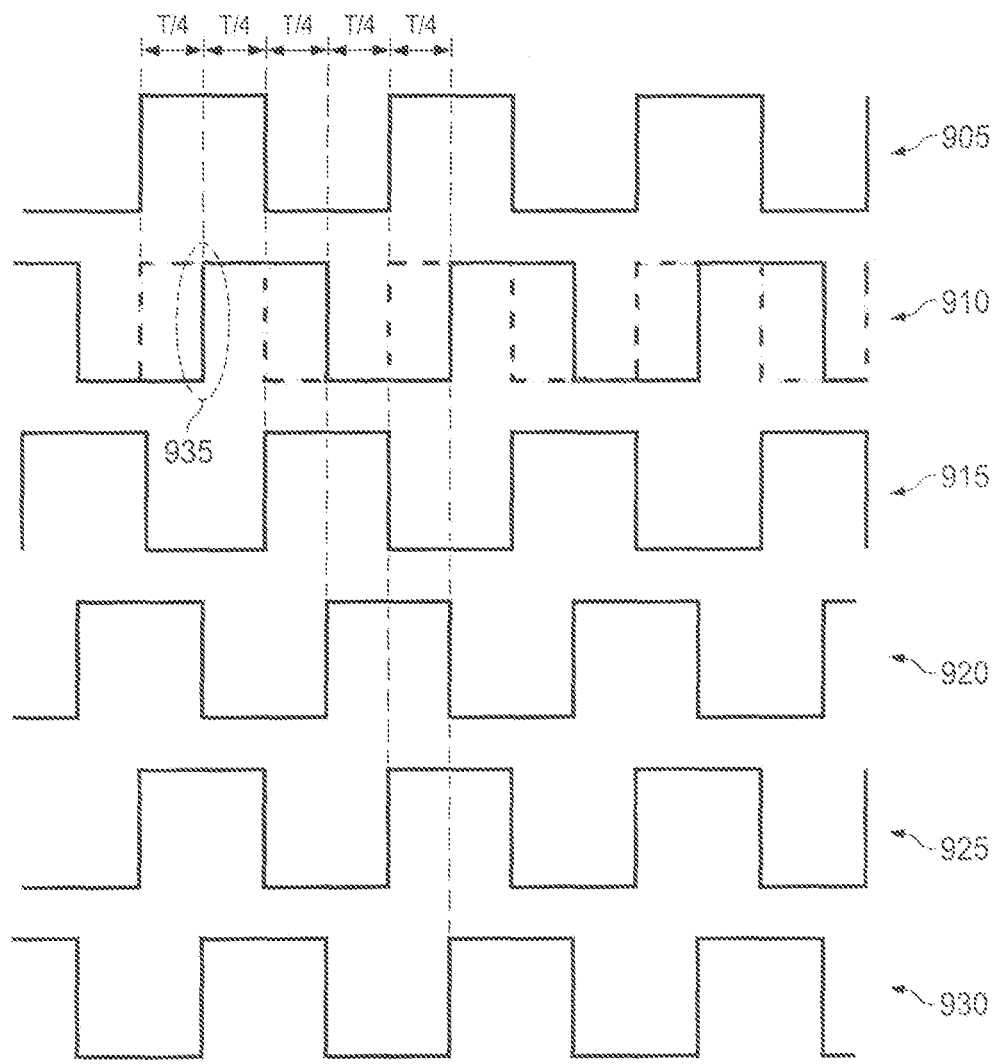
FIG. 9 illustrates waveforms for inputs and outputs of the phase interpolator of FIG. 8.

Referring to FIG. 9 now, a waveform 905 represents the input clock. A waveform 910 represents CLKINA and CLKINB. Solid lines of the waveform 910 indicate CLKINB and dotted lines of the waveform 910 indicate CLKINA. A waveform 915 represents out 2, a waveform 920 represents OUT 3, a waveform 925 represents OUT 4, and a waveform 930 represents OUT 1. CLKINB enters the DLL 720 through the MUX 710B.

Initially, the digital code of the variable delay circuit 610B is at one extreme value, for example the minimum value. As the digital code approaches the maximum value from the minimum value the CLKINB is delayed by T/4 with respect to the input clock. A time instant 935 represents the CLKINB delayed by T/4 with respect to the input clock. CLKINB passes through the delay element 705B and generates OUT 2 that is equal to CLKINB delayed by T/4 as illustrated in the waveform 915. Similarly, OUT 3 is equal to OUT 2 delayed by T/4 as illustrated in the waveform 920, OUT 4 is equal to OUT 3 delayed by T/4 as illustrated in waveform 925, and OUT 1 is equal to OUT 4 delayed by T/4 as illustrated in the waveform 930. The waveform 930 (OUT 4) is identical to the solid lines of the waveform 910 (CLKINB).

At time instant 935 since the digital code of the variable delay circuit 610B reaches the maximum value S1 is set to zero and S2, S3 and S4 are set to one. CLKINA now enters the DLL 720 through the MUX 710A. CLKINA and the OUT 4 (the waveform 925) are equal to each other at the time instant 935. CLKINA is advanced version of CLKINB by T/4. Since the inputs to the MUX 710A are similar at the time instant 935 there is no glitch in the waveform 930 (OUT 1) due to the switching. Similarly, there is no glitch in the waveform 915 (OUT 2), the waveform 920 (OUT 3), and the waveform 925 (OUT 4) due to the switching.

The variable delay circuit 610A and the variable delay circuit 305B of the phase interpolator 125 are calibrated such that difference between maximum delay and minimum delay is a specified value. For example, the difference is calibrated to be equal to T/4. Calibration process is explained in detail in conjunction with FIG. 10.

Figure 10:
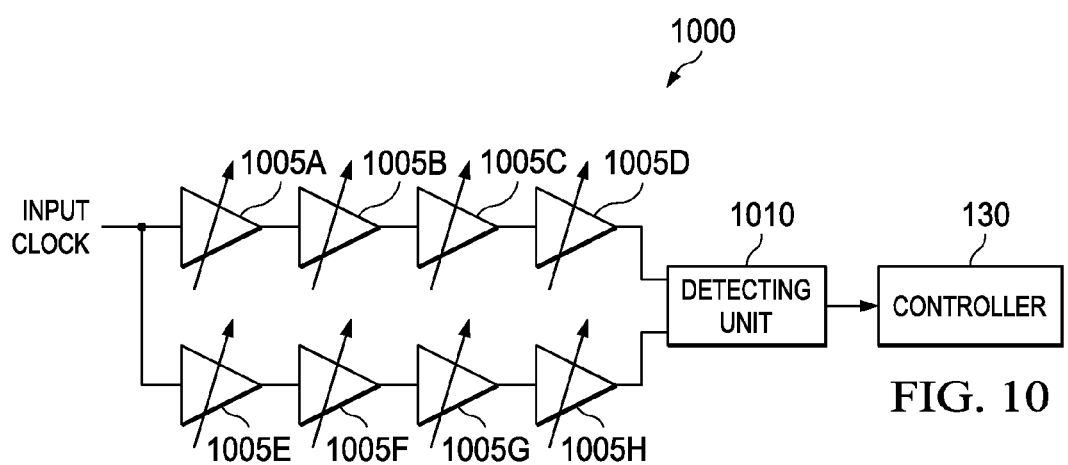
FIG. 10 illustrates a calibration circuit for a variable delay circuit of a phase interpolator, in accordance with one embodiment.

Referring to FIG. 10 now, a calibration circuit 1000 to calibrate the variable delay circuit 610A and the variable delay circuit 610B is provided. The calibration circuit 1000 can also be referred to as a master delay circuit and is coupled to the controller 130. The calibration circuit 1000 can be accessed by the controller 130 whenever the calibration is desired. The calibration can be desired depending on drift in variable delay generated by the variable delay circuits due to various factors, for example temperature and aging. The controller 130 generates calibration signals, for example digital codes or analog signals using the calibration circuit 1000. The calibration signals (second control signal) can then be stored and used by the controller 130 to enable generation of the first phase rotated signal and the second phase rotated signal.

The circuit 1000 includes a first plurality of variable delay circuits, for example a variable delay circuit 1005A to a variable delay circuit 1005D coupled in series connection. The circuit 1000 includes a second plurality of variable delay circuits, for example a variable delay circuit 1005E to a variable delay circuit 1005H coupled in series connection. The first plurality of variable delay circuits are coupled in parallel connection to second plurality of variable delay circuits. Input terminals of the variable delay circuit 1005A and of the variable delay circuit 1005E are coupled together to receive the input clock. Output terminals of the variable delay circuit 1005D and of the variable delay circuit 1005H are coupled together to a detecting unit 1010. The detecting unit 1010 is coupled to the controller 130. Structure of each variable delay circuit is similar to that of the variable delay circuit 610A or the variable delay circuit 610B.

In one example, the variable delay circuits are calibrated such that the difference between maximum delay and minimum delay is T/4. The maximum value of the digital code indicates or can be defined as value of the digital code or analog signal corresponding to the maximum delay generated by the variable delay circuits. The minimum value indicates or can be defined as value of the digital code or analog signal corresponding to minimum delay generated by the variable delay circuits. The difference between the maximum delay and the minimum delay is T/4 and difference between the maximum value and the minimum value is indicative of the difference between the maximum delay and the minimum delay.

In illustrated example, the difference between the maximum delay and minimum delay through each variable delay circuit is set to T/4. The second plurality of variable delay circuits are set at minimum value. The minimum value can be all zeroes corresponding to the minimum delay. Hence, difference in delay generated by first plurality of variable delay circuits and the second plurality of variable delay circuits is 4*T/4=T. The first plurality of variable delay circuits are also set at the minimum value and varied till the detecting unit 1010 detects a crossover between outputs of the first plurality of variable delay circuits and the second plurality of variable delay circuits. The crossover indicates that the output of the first plurality of variable delay circuits is delayed by T as compared to the output of the second plurality of variable delay circuits. The value corresponding to the crossover is set as the maximum value. The difference between the maximum value and the minimum value is indicative of T/4 delay for each variable delay circuit and is indicative of T delay between the output of the first plurality of variable delay circuits and the output of the second plurality of variable delay circuits. The maximum value and the minimum value can be replaced by maximum control voltage and minimum control voltage in case of analog implementation.

The detecting unit 1010 includes a phase frequency detector coupled to a filter in series connection in case of the analog implementation. The detecting unit 1010 includes a flip flop in case of digital implementation.

Figure 11:
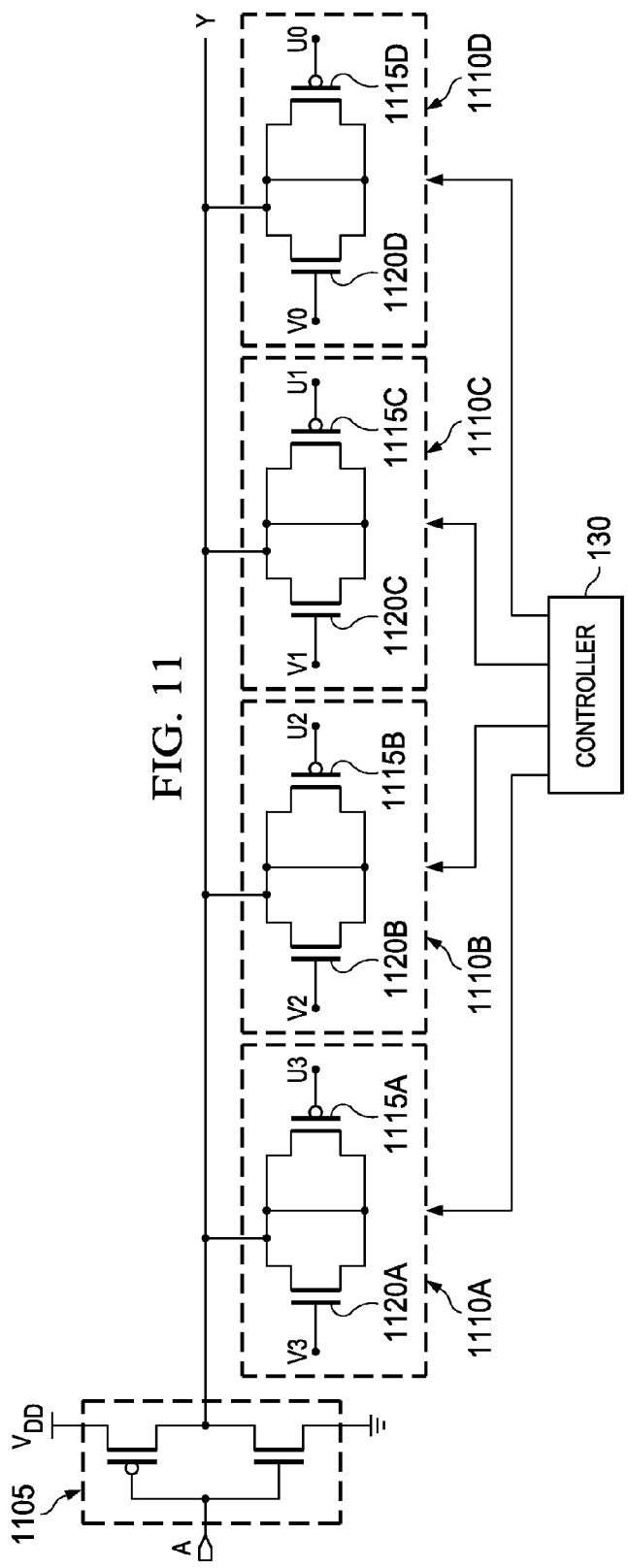
FIG. 11 illustrates a delay circuit, in accordance with one embodiment.

FIG. 11 illustrates a delay circuit, for example the variable delay circuit 305, the variable delay circuit 610A or the variable delay circuit 610B. The delay circuit includes an inverter 1105 coupled between input terminal and output terminal of the delay circuit. The inverter 1105 is a complementary metal oxide semiconductor (CMOS) based inverter. The delay circuit includes one or more capacitive elements, for example a capacitive element 1110A, a capacitive element 1110B, a capacitive element 1110C, and a capacitive element 1110D coupled to the output terminal of the delay circuit. The capacitive elements can be controlled using a control signal, for example a digital code in order to enable generation of a desired delay by the delay circuit. The capacitive elements in conjunction with the inverter 1105 generate the desired delay. The inverter 1105 delays the input clock, for example by a fixed amount. The capacitive elements are coupled to the controller 130 to receive the control signal. The control signal can be a combination of bits (U0, U1, U2 and U3). The control signal can include one bit for each capacitive element.

The capacitive element 1110A includes a positive metal oxide semiconductor (PMOS) transistor, for example a PMOS transistor 1115A and a negative metal oxide semiconductor (NMOS), for example an NMOS transistor 1120A. Source terminal and drain terminal of the PMOS transistor 1115A and of the NMOS transistor 1120A are coupled to each other and to the output terminal of the delay circuit. Gate terminal of the PMOS transistor 1115A is controlled by the control signal. Gate terminal of the NMOS transistor 1120A is also controlled by the control signal.

Gate connections of the PMOS transistor 1115A and of the NMOS transistor 1120A can be configured using the control signal to enable the PMOS transistor 1115A or the NMOS transistor 1120A to provide capacitance. When the gate terminal of the NMOS transistor 1120A is connected to the power supply or to bit 1, the NMOS transistor 1120A provides capacitance at the output terminal of the delay circuit and hence delays signal at the output terminal of the delay circuit. When the gate terminal of the NMOS transistor 1120A is connected to the ground supply or to bit 0, the NMOS transistor 1120A does not provide capacitance at the output terminal of the delay circuit. When the gate terminal of the PMOS transistor 1115A is connected to the ground supply or to bit 0, the PMOS transistor 1115A provides capacitance at the output terminal of the delay circuit and hence delays the signal at the output terminal. When the gate terminal of the PMOS transistor 1115A is connected to the power supply or to bit 1, the PMOS transistor 1115A does not provide capacitance at the output terminal of the delay circuit.

One of the PMOS transistors or the NMOS transistors of the capacitive elements receives the bits in the control signal and other one receives complement (V0, V1, V2 and V3) of the bits. V0 is complement of U0, V1 is complement of U1, V2 is complement of U2, and V3 is complement of U3.

Each transistor provides full capacitance when difference between voltages at gate and source of the transistor is greater than threshold voltage of that transistor.

The capacitive elements can be controlled using the control signal that is of same supply level as that to the inverter 1105.

The structure and working of the capacitive element 1110B, the capacitive element 1110C, and the capacitive element 1110D is similar to that of the capacitive element 1110A. The size of transistors used in the capacitive elements can be different to vary the delay generated by the delay circuit. For example, size of the transistors in the capacitive element 1110A can be such that capacitance provided by the capacitive element 1110A is eight times of that provided by the capacitive element 1110D.

By changing bits of the control signal, the capacitances provided by the capacitive elements can be changed and hence delay of the delay circuit can be changed. Delay of the delay circuit is proportional to the capacitance.

It is noted that the delay circuit can also be used as a delay cell of the DLL 310 or the DLL 720. It is also noted that the delay circuit can be used in applications other than phase interpolator.

The size of transistors of the capacitive elements can be small. Hence, the delay circuit can be designed to have fine resolution.

Figure 12:
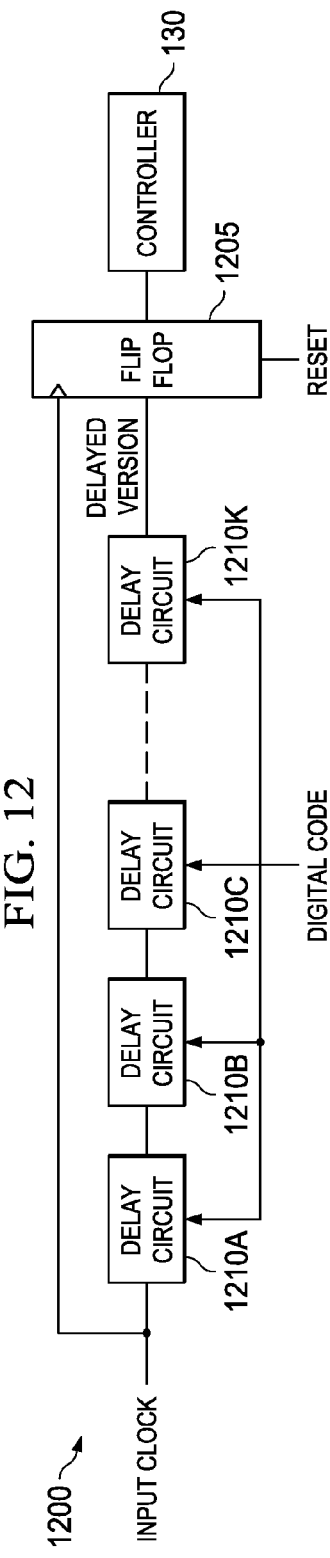
FIG. 12 illustrates a calibration circuit for the delay circuit of FIG. 11.

The control signal (second control signal) provided to the delay circuit by the controller 130 is determined using a calibration circuit that is explained in conjunction with FIG. 12.

Referring to FIG. 12 now, a calibration circuit 1200 is described. The calibration circuit 1200 includes a plurality of delay circuits (variable delay circuits), coupled in series connection. The delay circuits include a first delay circuit 1210A to a last delay circuit 1210K.

It is noted that in the present disclosure the calibration circuit 1200 is used for calibration of the delay circuit of FIG. 11. However, the calibration circuit 1200 can be used for calibrating any other delay circuit also. The delay circuits in the calibration circuit 1200 can be identical to the delay circuit for which calibration is needed.

Input to the first delay circuit 1210A is the input clock. The last delay circuit 1210K in the series connection is coupled to one input of a flip flop 1205 (detecting unit). The input clock is also provided to another input of the flip flop 1205. Hence, the flip flop 1205 receives the input clock and a delayed version of the input clock. The delayed version is obtained from the delay circuits. A reset signal is also provided to yet another input of the flip flop 1205. Number of delay circuit used in the calibration circuit 1200 can be any natural number.

In one example, a digital code provided to the delay circuits is varied from the minimum value to the maximum value. When the reset signal is low, the flip flop 1205 is activated. Output of the flip flop 1205 is observed by the controller 130. When an edge is obtained in the output, for example when the output becomes 0 from 1, the delayed version differs from the input clock by exactly half time period of the input clock as given by the formula below:

$$K \times d = T/2$$

where n is the number of instances, and d is the delay through each delay circuit.

Also, the delay through each delay circuit is T/(2K). In one example, the value of the digital code corresponding to the edge is stored. Hence, the delay through each delay circuit can be set at a required value by determining corresponding value of the digital code through the calibration circuit 1200. The digital code can then be stored and used by the controller 130.

It is noted that the delay circuit can also be calibrated using analog implementation of the detecting unit.

Figure 13:
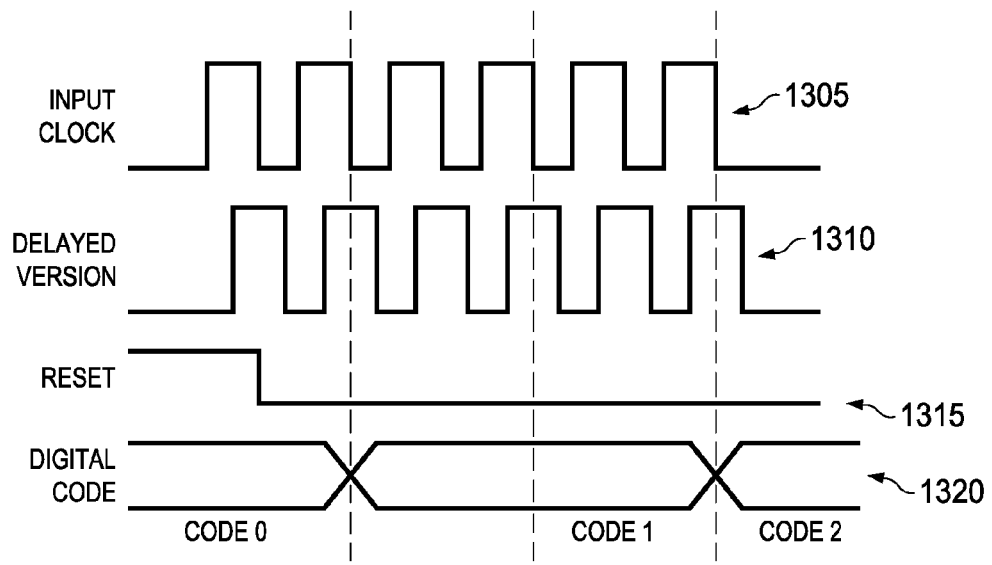
FIG. 13 illustrates waveforms of inputs and outputs of the calibration circuit of FIG. 12.

FIG. 13 illustrates timing diagram of various signals of the calibration circuit 1200. A waveform 1305 illustrates the input clock. A waveform 1310 illustrates the delayed version. A waveform 1315 illustrates the reset signal and a waveform 1320 illustrates the digital code.

As the digital code in the waveform 1320 varies upwards from code 0, the delayed version in waveform 1310 is delayed by certain duration. Each value of the digital code is maintained for at least two input clock periods to allow jitter to settle. When the delayed version in the waveform 1310 is exactly equal to the input clock in the waveform 1305 delayed by T/2, the digital code generates delay of each inverter equal to a value T/(2K).

Figure 14:
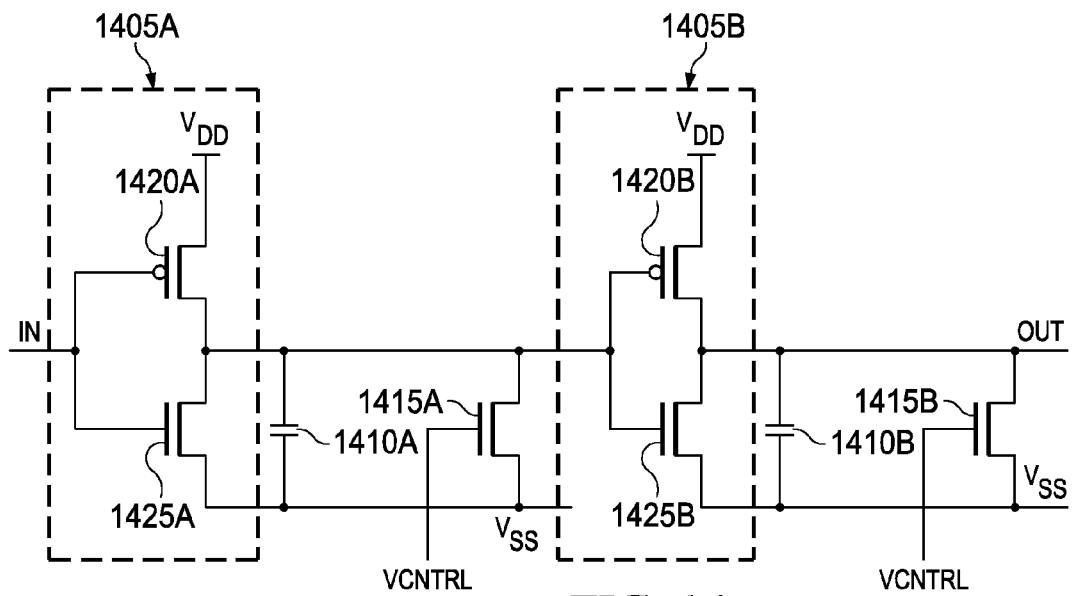
FIG. 14 illustrates a delay cell, in accordance with one embodiment.

FIG. 14 illustrates a delay cell, for example a delay cell of the DLL 310 or the DLL 720. The delay cell includes a plurality of inverters, for example an inverter 1405A and an inverter 1405B. Each inverter is a CMOS based inverter, and includes a PMOS transistor and an NMOS transistor with gates of the PMOS transistor and the NMOS transistor coupled to each other, and drain of the PMOS transistor being coupled to drain of the NMOS transistor. The inverter 1405A includes a PMOS transistor 1420A and an NMOS transistor 1425A. The inverter 1405B includes a PMOS transistor 1420B and an NMOS transistor 1425B.

A capacitor 1410A and an NMOS transistor 1415A are coupled in parallel connection to the NMOS transistor 1425A. Similarly, a capacitor 1410B and an NMOS transistor 1415B are coupled in parallel connection to the NMOS transistor 1425B.

The inverter 1405A along with the capacitor 1410A and the NMOS transistor 1415A provides a certain delay to an input signal (IN). Gate terminal of the NMOS transistor 1415A is controlled by an analog control voltage (VCNTRL). The analog control voltage provides a control on discharge of the capacitor 1410A, or fall time of signal at output terminal of the inverter 1405A. For example, when the analog control voltage is greater than a threshold voltage of the NMOS transistor 1415A, the NMOS transistor 1415A is activated. Hence, the capacitor 1415A that is charged by the signal at the output terminal of the inverter 1405A has a path to discharge. The analog control voltage thus controls discharge of the capacitor 1415A and hence controls delay of the input signal. The analog control voltage can be generated using the controller 130 in combination with other circuitry.

Functioning of the inverter 1405B is similar to that of the inverter 1405A.

It is noted that various other implementations of the delay cell can be used. The implementations can be analog or digital.

Figure 15:
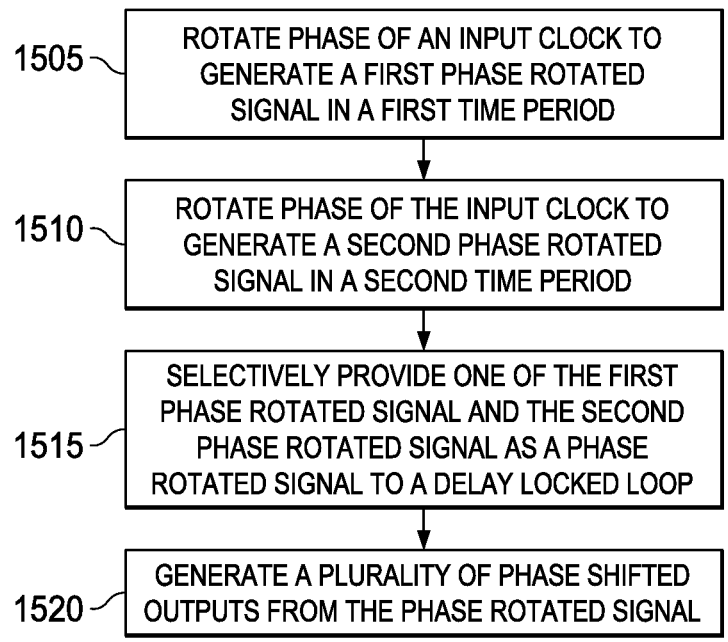
FIG. 15 illustrates a method for phase interpolation, in accordance with one embodiment.

FIG. 15 illustrates a method for phase interpolation by a phase interpolator, for example the phase interpolator 125.

At step 1505, phase of an input clock is rotated in a first time period to generate a first phase rotated signal. Rotation includes delaying the input clock. The first phase rotated signal can be generated by a first variable delay circuit, for example the variable delay circuit 610A. Degree by which the phase of the input clock is rotated is determined by a digital code or control voltage used to calibrate the first variable delay circuit. For example, the digital code can be varied from a minimum value to a maximum value. As the digital code is varied, the phase of the input clock is rotated incrementally. The digital code or the control voltage can be provided by a controller, for example the controller 130.

At step 1510, the phase of the input clock is rotated in a second time period to generate a second phase rotated signal. The second phase rotated signal is generated by a second variable delay circuit, for example the variable delay circuit 610B. The first variable delay circuit and the second variable delay circuit can together be referred to as a variable delay circuit. The second variable delay circuit is also calibrated using the digital code and rotation of the phase of the input clock is determined by the digital code. Slightly before the digital code of the first variable delay circuit approaches an extreme value, for example the maximum value, the digital code of the second variable delay circuit is set at the minimum value and the second phase rotated signal is allowed to settle before the digital code of the first variable delay circuit reaches maximum value. Once the digital code of the first variable delay circuit reached the maximum value, the second phase rotated signal can then be used for phase interpolation instead of resetting the digital code of the first variable delay circuit and using the first phase rotated signal that has not settled for phase interpolation.

In some embodiments, a calibration circuit, for example the calibration circuit 1000 is used to calibrate the first variable delay circuit and the second variable delay circuit. The calibration can be performed using the calibration circuit and the controller. The calibration can be defined as a process of determining the digital code (second control signal) or the control voltage (second control signal) based on which the first variable delay circuit and the second variable delay circuit can be controlled to generate the first phase rotated signal and the second phase rotated signal, respectively, with a desired delay.

At step 1515, one of the first phase rotated signal and the second phase rotated signal is selectively provided as a phase rotated signal to a DLL, for example the DLL 310 or the DLL 720.

In one embodiment, when the phase rotated signal is to be provided to the DLL 310 including a plurality of delay cells the a MUX, for example the MUX 605 can be used to select the first phase rotated signal or the second phase rotated signal as the phase rotated signal. The selection can be done by the MUX 605 in conjunction with the controller.

In another embodiment, when the phase rotated signal is to be provided to the DLL 720 then the selection of the first phase rotated signal or the second phase rotated signal as the phase rotated signal can be performed using the multiplexers, for example the MUX 710A to the MUX 710D, in conjunction with the controller.

At step 1520, a plurality of phase shifted outputs are generated by the DLL.

In one embodiment, when the DLL 310 is used to generate the phase shifted outputs then outputs of the DLL 310 can be selected and selectively outputted as the phase shifted outputs using a MUX, for example the MUX 405. The selection can be done by the MUX 405 in conjunction with the controller.

In another embodiment, when the DLL 720 is used to generate the phase shifted outputs then generating includes outputting the phase rotated signal or a phase shifted output by a MUX, for example the MUX 710B based on S2. A delay cell, for example the delay cell 715B then delays the phase rotated signal or the phase shifted output based on output of the MUX 710B. For example, when S2 is zero then the MUX 710B outputs the phase rotated signal and the delay cell 715B delays the phase rotated signal to generate another phase shifted output (out 2). When S2 is one then the phase shifted output (out 1) received by the MUX 710B is outputted to the delay cell 715B to generate another phase shifted output (out 2). Other multiplexers and the delay cells of the DLL 720 have functioning similar to that of the MUX 710B and the delay cell 715B respectively.

The phase shifted outputs are then used by a sampler, for example the sampler 120, to sample a data signal using the phase shifted outputs. In some embodiments, four phase shifted outputs are generated by the DLL. The four phase shifted outputs include the phase rotated signal delayed by T/4, T/2, 3T/4 and by T. The DLL and the variable delay circuit are included in the phase interpolator that is coupled to the sampler. The sampling helps in extracting data from the data signal.

The method described in FIG. 15 can be used in various phase interpolators illustrated in the present disclosure. Examples of such phase interpolators include the phase interpolator 125 illustrated in FIG. 6 and FIG. 8.

Figure 16:
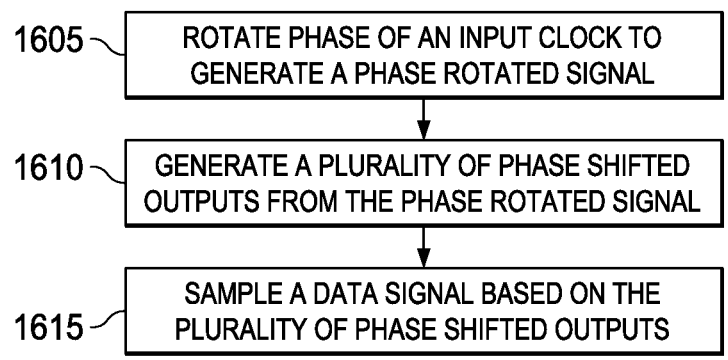
FIG. 16 illustrates a method for phase interpolation, in accordance with another embodiment.

Referring to FIG. 16 now, another method for phase interpolation by a phase interpolator, for example the phase interpolator 125 of FIG. 3, FIG. 4 and FIG. 7 is described.

At step 1605, phase of an input clock is rotated by a variable delay circuit, for example the variable delay circuit 305, to generate a phase rotated signal. The rotation of the phase can be controlled by a digital code (second control signal) or by an analog control voltage (second control signal). The second control signal can be generated by a controller using a calibration circuit, for example the calibration circuit 1200. The phase rotated signal is then provided to a DLL, for example the DLL 310 or the DLL 720.

At step 1610, a plurality of phase shifted outputs are generated from the phase rotated signal by the DLL.

In one embodiment, when the DLL 310 is used to generate the phase shifted outputs then outputs of the DLL 310 can be selected and selectively outputted as the phase shifted outputs using a MUX, for example the MUX 405. The selection can be done by the MUX 405 in conjunction with the controller.

In another embodiment, when the DLL 720 is used to generate the phase shifted outputs then generating includes outputting the phase rotated signal or a phase shifted output by a MUX, for example the MUX 710B based on S2. A delay cell, for example the delay cell 715B then delays the phase rotated signal or the phase shifted output based on output of the MUX 710B. For example, when S2 is zero then the MUX 710B outputs the phase rotated signal and the delay cell 715B delays the phase rotated signal to generate another phase shifted output (out 2). When S2 is one then the phase shifted output (out 1) received by the MUX 710B is outputted to the delay cell 715B to generate another phase shifted output (out 2). Other multiplexers and the delay cells of the DLL 720 have functioning similar to that of the MUX 710B and the delay cell 715B respectively.

At step 1615, a data signal is sampled by a sampler, for example the sampler 120, based on the phase shifted outputs. The phase shifted outputs can be used as phase or timing references to sample the data signal.

Figure 17:
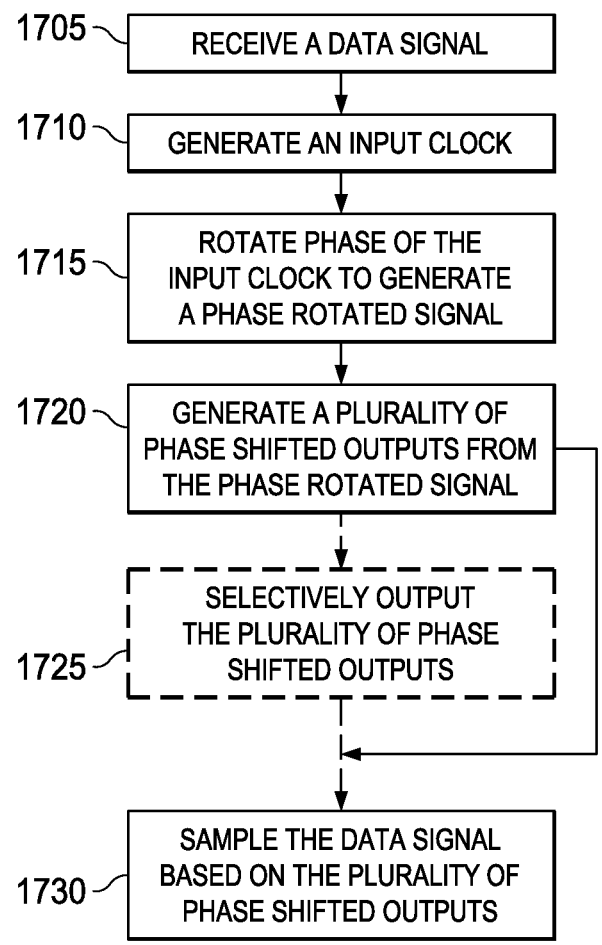
FIG. 17 illustrates a method for extracting data from a data signal, in accordance with one embodiment.

FIG. 17 illustrates a method for extracting data from a data signal by a receiving chip.

At step 1705, a data signal is received by a receiving unit, for example the receiving unit 115. The data signal can be transmitted by a transmitting unit, for example the transmitting unit 105 of a transmitting chip through a channel, for example the channel 135.

At step 1710, an input clock is generated at the receiving chip. The input clock can be generated using a PLL, for example the PLL 110B.

At step 1715, a phase rotated signal is generated by rotating a phase of the input clock. The phase can be rotated by a variable delay circuit, for example the variable delay circuit 305 or a variable delay circuit that includes a first variable delay circuit, for example the variable delay circuit 610A and a second variable delay circuit, for example the variable delay circuit 610B.

At step 1720, a plurality of phase shifted outputs is generated from the phase rotated signal by a DLL, for example the DLL 310 and the DLL 720. The plurality of phase shifted outputs is generated by delaying the phase rotated signal for time duration corresponding to required phase shift.

In some embodiments when the DLL 310 is used outputs of the DLL 310 can be selectively provided as the phase shifted outputs by a MUX, for example the MUX 405, at step 1725. The outputs of the DLL 310 are selectively provided to ensure that glitches do not appear in the phase shifted outputs due to a change in the phase rotated signal.

At step 1730, the data signal is sampled based on the phase shifted outputs to extract data by a sampler, for example the sampler 120. The data includes a correct bit transmitted by the transmitting chip to the receiving chip.

It is noted that the details provided in the present disclosure can vary for different embodiments. For example, the phase interpolator 125 can generate N phase shifted outputs, where N is a natural number. The DLL 310 or the DLL 720 can generate M outputs. For example, in some embodiments, when the digital code of the variable delay circuit 305 reaches an extreme value, for example the maximum value, then the digital code can be reset to value that is in middle of the maximum value and the minimum value. CLKINA is then advanced by T/8. Hence, the DLL 720 can include eight delay elements with delay of each delay element equal to T/8. Outputs of four delay elements from the eight delay elements can then selectively be outputted as the phase shifted outputs.

The MUX 405 can be an M:N MUX. The variable delay circuit 610A and the variable delay circuit 610B can be calibrated such that difference between delay when the digital code is at the maximum value and delay when the digital code is at the minimum value is equal to T/q, where q is a natural number. Further, when the digital code reaches the maximum value or the minimum value, the digital code can be reset by the controller 130 to any value, for example to a first value between the maximum value and the minimum value. The first value can be a mid-value between the maximum value and the minimum value. Also, when the digital code is reset to the first value, variable delay range can be available in both directions, for example towards the maximum value and towards the minimum value. The value to which the digital code has to be reset can be decided by the controller 130 based on desired variable delay range.

It is also noted that a portion of working of the controller 130 can also be performed using various other controllers, for example DLL controller present in and coupled to the DLL or a controller present in the variable delay circuit.

In the foregoing discussion, the term "coupled or connected" refers to either a direct electrical connection between the devices connected or an indirect connection through one or more passive or active intermediary devices. The term "signal" means data, or other signal.

The foregoing description sets forth numerous specific details to convey a thorough understanding of embodiments of the disclosure. However, it will be apparent to one skilled in the art that embodiments of the disclosure may be practiced without these specific details. Some well-known features are not described in detail in order to avoid obscuring the disclosure. Other variations and embodiments are possible in light of above teachings, and it is thus intended that the scope of disclosure not be limited by this Detailed Description, but only by the Claims.

What is claimed is:

1. A phase interpolator comprising:
a variable delay circuit to rotate phase of an input clock to generate a phase rotated signal;
wherein the variable delay circuit comprises:
a first variable delay circuit to rotate phase of the input clock in a first time period to generate and provide a first phase rotated signal as the phase rotated signal; and
a second variable delay circuit to rotate phase of the input clock in a second time period to generate and provide a second phase rotated signal as the phase rotated signal;
a controller, the controller generating a first control signal, enabling generation of the first phase rotated signal and the second phase rotated signal using a second control signal and generating the second control signal using a calibration circuit, the calibration circuit comprising:
a first plurality of variable delay circuits coupled in a series connection;
a second plurality of variable delay circuits coupled in a series connection, the second plurality of variable delay circuits being in parallel connection with the first plurality of variable delay circuits; and
a detecting unit coupled to the first plurality of variable delay circuits and to the second plurality of variable delay circuits to detect a crossover between outputs of the first plurality of variable delay circuits and the second plurality of variable delay circuits, and to determine the second control signal based on the crossover;
a delay locked loop coupled to the variable delay circuit to generate a plurality of phase shifted outputs, the delay locked loop comprising a plurality of delay elements, each delay element comprising:
a multiplexer that is configurable using the first control signal to output one of
the phase rotated signal and
a phase shifted output of the plurality of phase shifted outputs, and
a delay cell coupled to the multiplexer to delay one of the phase rotated signal and
the phase shifted output to generate another phase shifted output of the plurality of phase shifted outputs.

2. A phase interpolator comprising:
a variable delay circuit to rotate phase of an input clock to generate a phase rotated signal;
a delay locked loop coupled to the variable delay circuit to generate a plurality of phase shifted outputs, the delay locked loop comprising a plurality of delay elements, each delay element comprising:
a multiplexer that is configurable using a first control signal to output one of
the phase rotated signal and
a phase shifted output of the plurality of phase shifted outputs, and
a delay cell coupled to the multiplexer to delay one of the phase rotated signal and
the phase shifted output to generate another phase shifted output of the plurality of phase shifted outputs;
wherein the variable delay circuit comprises:
an inverter coupled between an input terminal of the variable delay circuit and an output terminal of the variable delay circuit; and
one or more capacitive elements coupled to the output terminal of the variable delay circuit to enable generation of desired delay;
a controller, the controller generating a second control signal using a calibration circuit, the calibration circuit comprising:
a plurality of variable delay circuits coupled in a series connection; and
a flip-flop coupled to an output terminal of the plurality of variable delay circuits to detect an edge at the output terminal.

* * * * *